(12) United States Patent
Takahashi et al.

(10) Patent No.: US 8,198,603 B2
(45) Date of Patent: Jun. 12, 2012

(54) SAMPLE PREPARING DEVICE AND SAMPLE POSTURE SHIFTING METHOD

(75) Inventors: Haruo Takahashi, Chiba (JP); Ikuko Nakatani, Chiba (JP); Junichi Tashiro, Chiba (JP)

(73) Assignee: SII NanoTechnology Inc. (JP)

( * ) Notice: Subject to any disclaimer, the term of this patent is extended or adjusted under 35 U.S.C. 154(b) by 422 days.

(21) Appl. No.: 12/290,397

(22) Filed: Oct. 29, 2008

(65) Prior Publication Data

US 2009/0114842 A1 May 7, 2009

(30) Foreign Application Priority Data

Oct. 29, 2007 (JP) .................... 2007-280006

(51) Int. Cl.
  *H01J 37/20* (2006.01)
  *G21K 5/10* (2006.01)
  *G01N 1/28* (2006.01)
(52) U.S. Cl. ........... 250/442.11; 250/440.11; 250/492.2; 250/491.1; 250/492.3; 73/864.91
(58) Field of Classification Search ............. 250/442.11, 250/440.11, 492.2, 491.1, 492.3; 73/864.91
See application file for complete search history.

(56) References Cited

U.S. PATENT DOCUMENTS

| | | | |
|---|---|---|---|
| 6,781,125 B2 * | 8/2004 | Tokuda et al. | 850/1 |
| 7,465,945 B2 * | 12/2008 | Tokuda et al. | 250/492.3 |
| 7,470,918 B2 * | 12/2008 | Tokuda et al. | 250/492.1 |
| 2002/0166976 A1 | 11/2002 | Sugaya et al. | 250/440.11 |
| 2006/0011868 A1 * | 1/2006 | Kidron et al. | 250/492.22 |

FOREIGN PATENT DOCUMENTS

JP 2006073270 3/2006

OTHER PUBLICATIONS

Kendrick A B et al: "Cassette-based in-situ TEM sample inspection in the dual-beam FIB", Journal of Physics: Conference Series 48: Electron Micoscopy and Analysis Group Conference 2007 (EMAG 2007): Characterisation, Manipulation and Fabrication on the Nanoscale; Sep. 3-8, 2007; Glasgow, UK, vol. 126, No. 1, Aug. 1, 2008, p. 12082, XPO20147584, Institute of Physics Publishing, Bristol, GB, ISSN: 1742-6596, *section "3. Method", in particular text on p. 3 between figures 5 and 6 figure 5*.
[Online] The Institution of Electrical Engineers, Stevenage, GB; 2008, Kendrick A B et al: "Cassette-based in-situ TEM sample inspection in the dual-beam FIB", XP002570679, Database accession No. 10502793 *abstract*.

* cited by examiner

*Primary Examiner* — Nikita Wells
(74) *Attorney, Agent, or Firm* — Adams & Wilks

(57) ABSTRACT

A sample preparing device has a sample stage that supports a sample and undergoes rotation about a first rotation axis to bring a preselected direction of the sample piece into coincidence with an intersection line between a first plane formed by a surface of the sample piece and a second plane. A manipulator holds sample piece of the sample and undergoes rotation about a second rotation axis independently of the sample stage to rotate the sample piece to a preselected position in the state in which the preselected direction of the sample piece coincides with the intersection line. The manipulator is disposed relative to the sample stage so that an angle between the second rotation axis and the surface of the sample is in the range of 0° to 45°. The second plane corresponds to a plane obtained by rotating around the second rotation axis a line segment which is vertical to the surface of the sample and of which one end corresponds to an intersection between the surface of the sample and the second rotation axis.

20 Claims, 5 Drawing Sheets

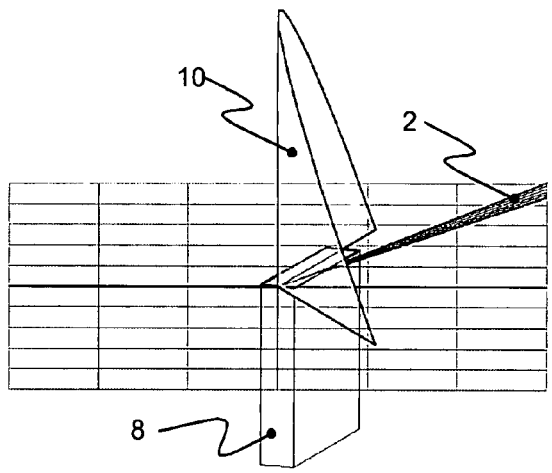
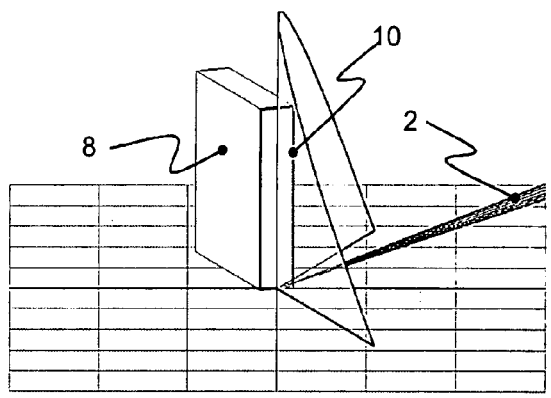
Fig.4  Fig.5
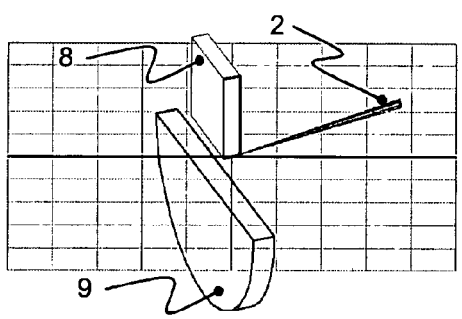
Fig.6

SAMPLE PREPARING DEVICE AND SAMPLE POSTURE SHIFTING METHOD

BACKGROUND OF THE INVENTION

1. Field of the Invention

The present invention relates to a focused ion beam system and a composite charged particle beam device for preparing a sample for a transmission electron microscope.

2. Background Information

Focused ion beam systems are widely used to prepare a sample for a transmission electron microscope (TEM). Particularly, in fields of process monitoring and failure analysis for semiconductor devices, the preparation of a sample by a focused ion beam is an essential technique because positioning accuracy of a sample piece is very high.

The preparation of a TEM sample by a focused ion beam is performed such that a thin observing piece is prepared by positioning a site to be observed in a sample by an ion microscope image of a focused ion beam system and removing both sides of an observing cross section by ion beam etching. The prepared thin piece is moved to a sample table for TEM observation to be subjected to the TEM observation.

The cases where a TEM sample is required to have a thickness of 100 nanometers or less increase due to the miniaturization of semiconductor devices. Such an extremely thin sample has a high risk of being damaged while being moved to a sample table for TEM observation. Therefore, in many cases, the thin sample is prepared thick to a certain extent to be transferred to the sample table for TEM observation and is finally thinned on the sample table for TEM observation. A typical size of the thin TEM sample piece is about 10 micrometer squares and a thickness thereof is about several micrometers. There is an example in which a manipulator in which a needle having a very sharp tip end is mounted on an actuator capable of performing a precision operation is used to handle such a tiny sample. The needle is brought close to the sample to be fixed thereto by ion beam deposition, and the sample is brought close to the TEM sample table by the operation of the actuator and a sample stage. Then, the ion beam deposition is performed again to fix the sample to the sample table. Normally, these operations are performed in a visual field of a focused ion beam system, and thus freedom in operation of the manipulator is small. Accordingly, the extracted sample is fixed to the sample table in the same posture as that at the time when the sample is extracted. In many cases, a wiring layer on the upper side and a substrate on the lower side in a semiconductor sample are fixed to a sample table.

In this state, final thinning is performed. However, a finished state of the thinning on the lower part of the sample may be influenced by the structure of the upper part thereof since efficiencies of etching by an ion beam are different for sites such as a wiring part, an interlayer insulation film and the substrate. Such an influence of the structure of the upper part is acknowledged as a problem in observation of the vicinity of a gate oxide film of a MOS transistor or in observation of a bottom of a via.

In order to solve such a problem, Patent Document 1 discloses a method of isolating a sample matrix from the back side to be turned upside down and a method of using a manipulator having a rotation axis and a tilt mechanism. In the method of isolating a sample matrix from the back side to be turned upside down, sites to be subjected to the TEM observation in a majority of samples are disposed at a depth of about 10 um from the front side, but at a depth of several hundred micrometers or more from the back side. Thus, it is required to perform special preprocessing such as preliminary polishing of the back side to extract samples from the back side. Further, it is very difficult to detect a polishing endpoint and there is a big problem in practicality. In the method of using a manipulator having a rotation axis and a tilt mechanism, a tilt of about several ten degrees is required in response to a manipulator attachment angle. It is considered that a translation mechanism is required which has a stroke of about several ten millimeters as well as a tilt in order to place a target sample in a visual field of a focused ion beam system with a tilt of several ten degrees. In addition, in a composite system of a focused ion beam system and an electron scanning microscope, which is in widespread use in recent years, a space near a sample is greatly restricted, and thus it is anticipated that it is very difficult to mount these mechanisms.

The importance of a method of fixing a sample piece of which a posture is rotated to a TEM sample table and finally thinning the sample piece is widely recognized, however, a device for efficiently performing the process of extracting a thin TEM sample piece, shifting a posture and fixing the thin TEM sample piece to a sample table is not yet provided.

[Patent Document] JP-A-2007-108105

In consideration of the technical trends described above, a task of the invention is to provide a sample preparing device in which a posture of a sample piece is easily rotated by 90 degrees, 180 degrees or an arbitrary number of degrees to fix the sample piece to a sample table.

SUMMARY OF THE INVENTION

A first aspect of the invention for solving the above-described task is a sample preparing device characterized in that a sample stage and a manipulator are provided. The sample stage has at least one sample stage rotation axis capable of being rotated around the sample stage independently of the manipulator. The manipulator has a manipulator rotation axis and can support a sample piece at a position substantially overlapping with the manipulator rotation axis. An attachment angle of the manipulator rotation axis measured from a surface of the sample stage is in the range of 0 to 45 degrees. After a certain direction of the sample piece is allowed to coincide with an intersection line made by two planes of a surface of the sample and a conical side plane obtained by rotating, around the manipulator rotation axis, a line segment which is vertical to the surface of the sample and of which one end is an intersection of the surface of the sample and the manipulator rotation axis, the sample piece is supported by the manipulator and the manipulator rotation axis is operated.

A second aspect of the invention for solving the above-described task is the sample preparing device according to the first aspect, characterized in that the sample stage is further provided with a sample piece table for transferring and fixing the sample piece and the sample piece can be fixed to the sample piece table in a state in which a desired certain direction is upright.

A third aspect of the invention for solving the above-described task is the sample preparing device according to the second aspect, characterized in that the sample piece is a thin sample for a transmission electron microscope for cross section observation or a thin sample for a transmission electron microscope before finish processing and the certain direction of the sample piece is a horizontal direction parallel to an observing cross section thereof. In addition, the sample piece table is installed to be upright with respect to the surface of the sample stage, and the sample piece can be fixed to the sample piece table in a posture in which the sample piece is rotated by 90 degrees around a normal line to the observing cross section.

A fourth aspect of the invention for solving the above-described task is the sample preparing device according to the second aspect, characterized in that the sample piece is a thin sample for an electron microscope for cross section observation or a thin sample for an electron microscope before finish processing and a posture of the sample piece can be controlled such that an observing cross section thereof becomes horizontal by setting a direction of a normal line to the observing cross section as the certain direction of the sample piece. In addition, after the sample piece table is horizontally installed with respect to the surface of the sample stage and the rotation axis of the sample stage is operated to rotate the sample piece table to a desired position with respect to the sample piece, the sample piece can be fixed to the sample piece table such that an arbitrary direction of the observing cross section of the sample piece is upward.

A fifth aspect of the invention for solving the above-described task is the sample preparing device according to the second aspect, characterized in that the sample piece is a thin sample for a transmission electron microscope for plane observation or a thin sample for a transmission electron microscope before finish processing. The sample piece table is vertically installed with respect to the sample stage and a horizontal plane of the sample piece is allowed to be upright to fix the sample piece to the sample piece table.

A sixth aspect of the invention for solving the above-described task is the sample preparing device according to any one of the third to fifth aspects, having a function of automatically controlling the sample stage so as to have a proper angle with respect to the manipulator rotation axis by specifying the certain direction of the sample piece.

A seventh aspect of the invention for solving the above-described task is a method of shifting a sample posture by using a manipulator which has a manipulator rotation axis and can support a sample piece at a position substantially overlapping with the manipulator rotation axis and in which an attachment angle of the manipulator rotation axis measured from a surface of a sample stage is in the range of 0 to 45 degrees, and the sample stage which has at least one sample stage rotation axis capable of being rotated around the sample stage independently of the manipulator. After a certain direction of the sample piece is allowed to coincide with an intersection line made by two planes of a surface of the sample piece and a conical side plane obtained by rotating, around the manipulator rotation axis, a line segment which is vertical to the surface of the sample and of which one end is an intersection of the surface of the sample and the manipulator rotation axis, the sample piece is supported by the manipulator and the manipulator rotation axis is operated.

According to the invention, it is possible to provide a device in which a posture of a sample piece is easily rotated by 90 degrees, 180 degrees or an arbitrary number of degrees to fix the sample piece to a sample piece table. By using the device, a high-quality TEM sample can be very efficiently prepared without being influenced by wiring structure, and thus it is possible to make a significantly large contribution to fields of process monitoring and failure analysis for a semiconductor field.

The invention can solve the task since a rotation axis is provided for a manipulator and combined with the control of a generally widely used type of sample stage, and a form of a device to which the invention can be applied is hardly limited. Further, as compared with a normal method in which the posture of the sample piece is not rotated, special preprocessing or complicated operations are not added. For these reasons, it can be said that efficiency is very good and practicality is high in view of two points, that is, simplicity of operation and small limit in a device to which the invention is applied.

BRIEF DESCRIPTION OF THE DRAWINGS

FIG. 4 is a view showing a state just after a sample piece is fixed to a manipulator in a first embodiment.

FIG. 5 is a view showing a state in which the sample piece is rotated by 90 degrees by operating a manipulator rotation axis in the first embodiment.

FIG. 6 is a view showing a positional relation of a sample piece table and the sample piece in the first embodiment;

DETAILED DESCRIPTION OF THE INVENTION

First Embodiment

Figure 1:
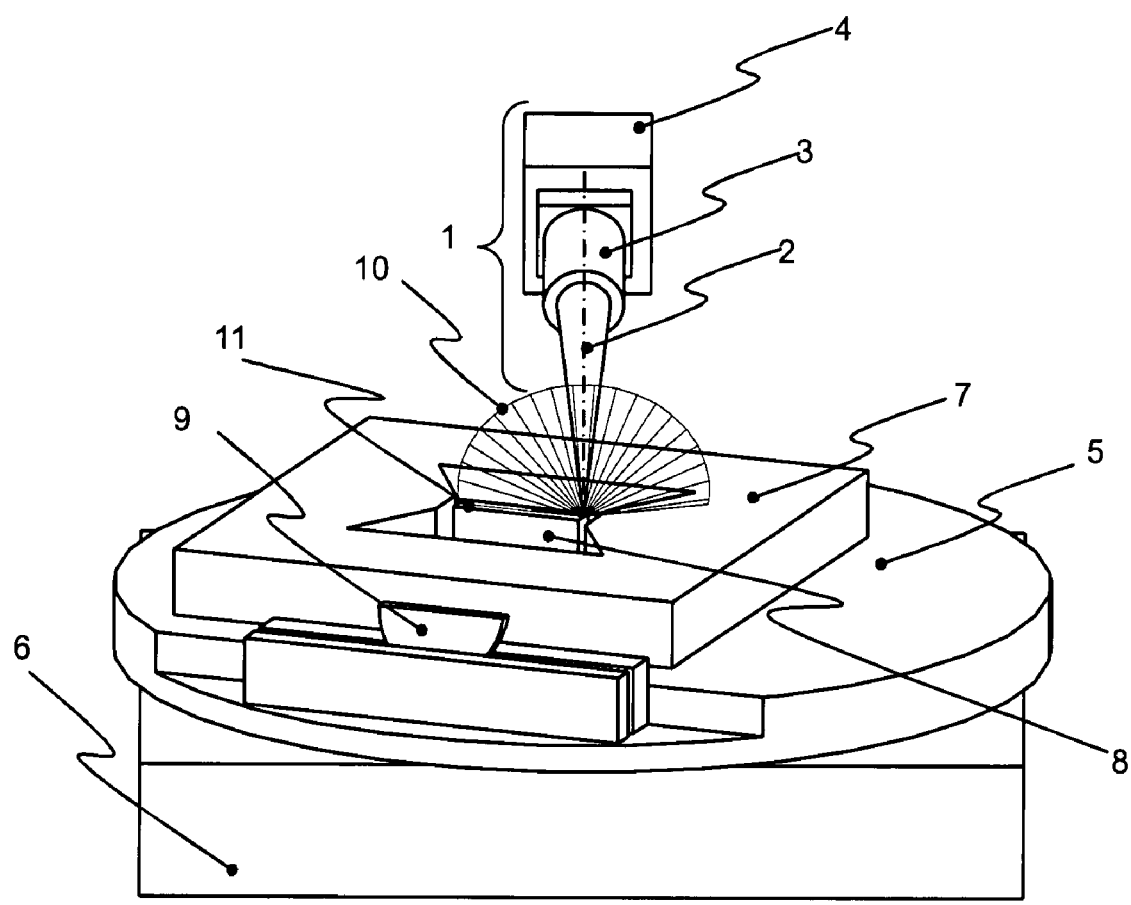
FIG. 1 is a perspective view showing the configuration of a sample preparing device according to the invention.
Figure 2:
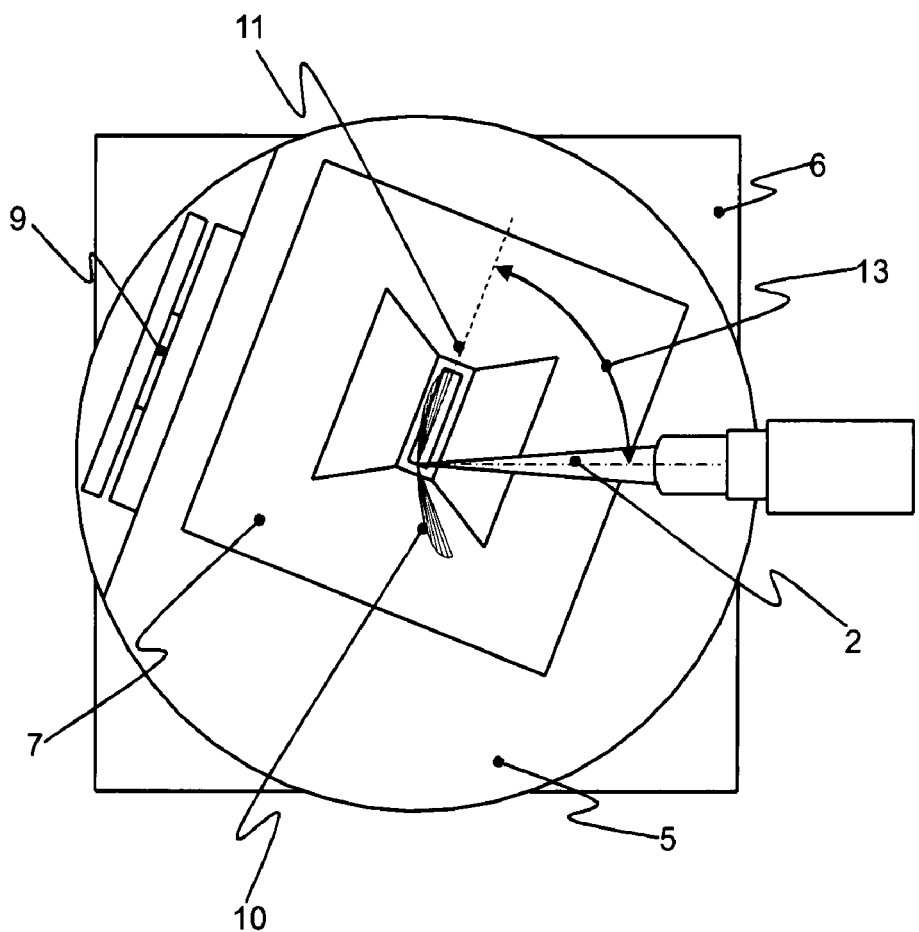
FIG. 2 is a top view showing the configuration of the sample preparing device according to the invention.
Figure 3:
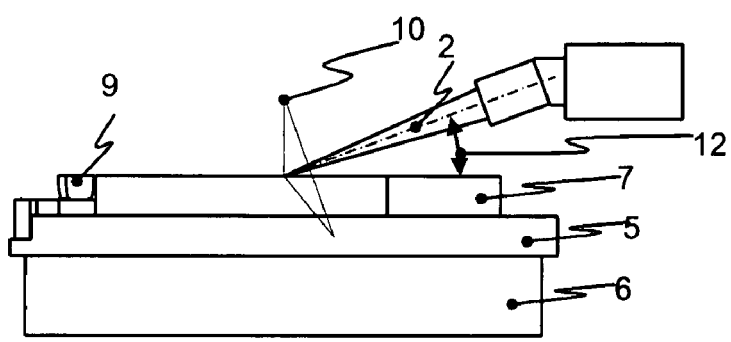
FIG. 3 is a side view showing the configuration of the sample preparing device according to the invention.

FIGS. 1 to 3 show schematic views of a sample preparing device in which the invention is embodied. FIG. 1 is a perspective view, FIG. 2 is a top view and FIG. 3 is a side view.

Size ratios are different from actual size ratios to show relations of parts in a way easy to understand.

Herein, as an example, there is disclosed a focused ion beam system in which the invention is incorporated.

A sample stage has five axes. A rotation stage 5 having a stage rotation axis is disposed on a XYZ orthogonal stage 6 to make the stage rotation axis cooperate with a XY axis, thereby allowing a rotation operation to be performed around an arbitrary point on the sample stage. Such a rotation operation is referred to as the compucentric rotation in the description described below. Further, these stages are disposed on a tilt stage. If necessary, an angle of a surface of the sample stage can be changed with respect to a focused ion beam. In the following description, it is assumed that a focused ion beam lens barrel is vertically disposed, the surface of the sample stage is horizontal and a surface of a sample is also horizontal. This assumption is used to avoid the description of positional relations of elements in the specification becomes complicated by overly generalized expressions, and does not limit the scope of the invention.

A manipulator 1 is configured such that a manipulator rotation mechanism 3 is attached to a triaxial actuator 4 of which a position can be controlled to within one micrometer and a needle having a very sharp tip end is attached so as to be substantially matched with a manipulator rotation axis 2.

The manipulator 1 is fixed independently of the tilt stage such that a tip end thereof is disposed around a visual field of the focused ion beam system without being influenced by the translation operations and rotation operations of the stages. The manipulator 1 may be installed independently of all of the stage mechanisms. However, the true nature of the invention is based on a positional relation of the manipulator rotation axis 2 and a sample piece 8 in a certain direction at the time when a sample is actually fixed to the manipulator. A difference in fixing position of the manipulator 1 does not have an effect on the recognition of the scope of the invention.

An angle between the manipulator rotation axis 2 and the surface of the rotation stage 5, that is, a manipulator attachment angle 12 shown in FIG. 3 is arbitrarily selected in the range of 0 to 45 degrees. Herein, the description will be given to the case where the manipulator is attached at an angle of 20 degrees.

A sample piece table 9 and a sample 7 are attached to the rotation stage 5. The sample piece table 9 has a shape of a thin disk having a diameter of about 3 mm or a shape of the disk with a notch. The shape based on the thin disk of 3 mm is a shape which can be mounted on most of commercially available TEM. In this example, the sample piece table 9 having a substantially semicircle shape is attached such that a circular part thereof is upright while being disposed on the lower side. The sample 7 includes a site to be prepared as a TEM sample, and the sample piece including this site is extracted. Herein, a semiconductor element will be described as an example of the sample 7. As for the extracted semiconductor element, both sides of an area including a certain cross section to be observed is subjected to ion beam etching by the focused ion beam system, and thus the sample piece 8 having a shape of an upright plate is prepared.

Next, prior to the description of a setting method of the positional relation of the sample piece 8 and the manipulator rotation axis 2, several definitions are provided to represent the relation of an angle. First, there is assumed a virtual cone 10 obtained by rotating a normal line with respect to a surface of the sample 7, of which one end is an intersection of the manipulator rotation axis 2 and the surface of the sample 7, around the manipulator rotation axis 2 Second, a horizontal plane including an apex of the virtual cone 10 is considered and a line where the horizontal plane and the virtual cone 10 intersect with each other is set as an intersection line 11.

Third, an angle representing the orientation of the intersection line 11 is set as an intersection line azimuth 13. The intersection line azimuth 13 defines, as 0 degree, a state in which the manipulator rotation axis and the intersection line 11 overlap with each other as viewed from directly above.

Hereinafter, using the terms defined above, the setting method of the positional relation of the manipulator rotation axis 2 and sample piece 8 will be described in detail. The intersection line azimuth 13 is set as a function of the manipulator attachment angle 12. When the manipulator attachment angle 12 is 20 degrees, the intersection line azimuth 13 is 68.7degrees. The sample piece 8 has a shape of an upright plate as described above, and thus an upper plane thereof has a long rectangular shape. The rotation stage 5 and the XYZ orthogonal stage 6 are allowed to perform the compucentric rotation operation such that a long side of the rectangular shape of the sample piece 8 coincides with the intersection line 11.

In this state, the manipulator 1 is brought close to the sample piece 8, and the sample piece 8 is fixed (mounted) to the manipulator 1. In this case, the fixing is performed in such a manner that a deposition film formed by an ion beam is deposited to be laid over the tip end of the manipulator 1 and the sample piece 8. When the sample piece 8 is fixed to the manipulator 1, the triaxial actuator 4 of the manipulator 1 is operated to extract the sample piece 8 from the sample 7. After that, by the operation of the manipulator rotation mechanism 3, the sample stage is retreated such that the manipulator 1 and the sample 7 do not interfere with each other. In greater detail, a Z axis of the XYZ orthogonal stage 6 is operated to move the sample stage downward, and thus the retreat is performed. An amount of the retreat may be properly determined in accordance with rotation accuracy.

In this state, when the manipulator rotation axis 2 is operated, the long side of the upper plane of the sample piece 8 fixed to the manipulator 1 naturally rotates around the manipulator rotation axis 2 while coinciding with the intersection line 11, and coincides with the virtual cone 10. The virtual cone 10 is defined by rotating the line segment vertical to the surface of the sample stage around the manipulator rotation axis 2, and thus a rotation angle of the manipulator rotation axis 2 vertical to the long side of the upper plane of the sample piece 8 is necessarily found. By stopping the manipulator rotation axis 2 at a place where an upper side is upright, a posture in which the plate-shaped sample piece 8 is rotated by 90 degrees can be made. Determining whether the upper side is upright or not is performed by observation, or the rotation angle of the manipulator rotation axis 2 is obtained by geometric calculation to perform the rotation by required degrees. This rotation angle also can be calculated as a function of the manipulator attachment angle 12. When the manipulator attachment angle 12 is 20 degrees, the required rotation angle is 97.6 degrees. FIG. 4 is a view schematically showing a state before the manipulator rotation axis 2 is operated in this embodiment, and FIG. 5 is a view schematically showing a state in which the plate-shaped sample piece 8 is rotated by 90 degrees by operating the manipulator rotation axis 2. In these views, the sample piece 8, the manipulator 1 and the virtual cone 10 are drawn.

Subsequently, away to fix the sample piece 8 to the sample piece table 9 will be described. First, the XYZ orthogonal stage 6 is operated to move the sample piece table 9 to the visual field of the focused ion beam system. The sample piece table 9 is held while being upright, as described above. As shown in FIG. 6, the rotation stage 5 and the XYZ orthogonal stage 6 are allowed to perform the compucentric rotation operation such that directions of the sample piece table 9 and the sample piece 8 coincide with each other. In addition, the triaxial actuator 4 of the manipulator 1 is operated to bring the sample piece 8 extremely close to the sample piece table 9, and then the sample piece is fixed to the sample piece table 9 by the deposition film formed by an ion beam. Finally, using the focused ion beam system, the manipulator 1 and the sample piece 8 are separated by ion beam etching. In this manner, the plate-shaped sample piece 8 can be fixed to the sample piece table 9 in a state in which the sample piece is rotated by 90 degrees. When the example described herein is compared with a method which is generally used to transfer a TEM sample to a sample table without shifting in posture of the sample piece, only the setting of the position of the sample piece 8 and the rotation of the manipulator rotation axis 2 are the increased processes, and the task of providing a method of fixing the sample piece easily rotated by 90 degrees can be solved.

Second Embodiment

A second embodiment will be described which differs in form and function from the first embodiment. In this embodiment, the positional relation of the intersection line 11 and the sample piece 8 are different in the course of setting the positions of the sample piece 8 and the manipulator rotation axis 2 in the first embodiment. In this embodiment, the position of the sample piece 8 is set such that a short side of the upper plane of the upright plate-shaped sample piece 8 coincides with the intersection line azimuth 13. This position is a position obtained by rotating the result of the position setting performed in the first embodiment by 90 degrees. In this state, the sample piece 8 is fixed to the manipulator 1, the sample stage is retreated, and then the manipulator rotation axis 2 is operated in the same manner as in the first embodiment. In this state, a condition is necessarily provided in which a direction of the short side of the upper plane of the plate-shaped sample piece 8, in other words, a thickness direction of the plate-shaped sample piece 8, is upright or vertical. When the manipulator rotation axis 2 is stopped in a state in which the thickness direction is vertical, the plate-shaped sample piece 8 has a posture that is parallel to the surface of the sample stage.

Figure 7:
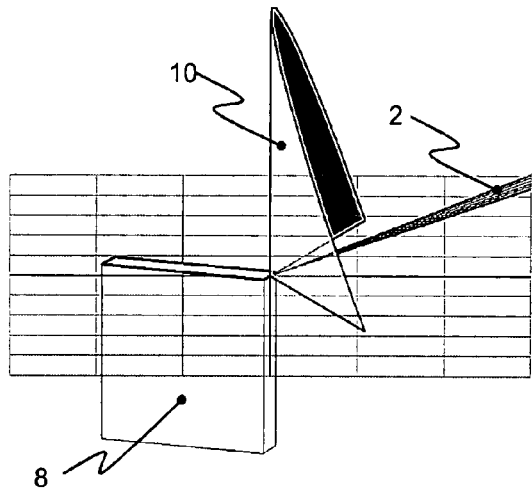
FIG. 7 is a view showing a state just after a sample piece is fixed to the manipulator in a second embodiment.
Figure 8:
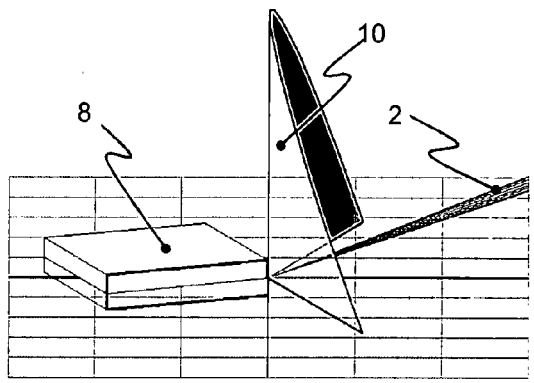
FIG. 8 is a view showing a state in which a posture of the plate-shaped sample piece is horizontally shifted by operating the manipulator rotation axis in the second embodiment.
Figure 9:
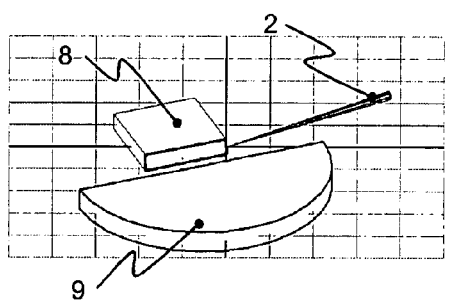
FIG. 9 is a view showing the positional relation of the sample piece and the sample piece table when the sample piece is fixed in a state in which the rotation is performed by 180 degrees in the second embodiment.
Figure 10:
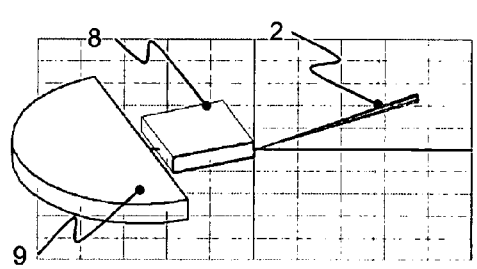
FIG. 10 is a view showing the positional relation of the sample piece and the sample piece table when the sample piece is fixed in a state in which the rotation is performed by 90 degrees in the second embodiment.

In this embodiment, the sample piece table 9 is fixed to the sample stage in parallel relation thereto. As described above, the plate-shaped sample piece 8 is also rotated in a horizontal posture. Accordingly, by using the sample stage 5, the direction of the sample piece table 9 can be arbitrarily selected with respect to the sample piece 8. After the sample piece 8 and the sample piece table 9 are adjusted to be in a desired positional relation, the sample piece 8 is attached to the sample piece table 9 in the same process as in the first embodiment. Consequently, the sample piece 8 can be attached to the sample piece table 9 at an arbitrary angle. FIG. 7 is a view schematically showing a state before the manipulator rotation axis 2 is operated in this embodiment, and FIG. 8 is a view schematically showing a state in which the posture of the plate-shaped sample piece 8 is horizontally shifted by operating the manipulator rotation axis 2 in this embodiment. In addition, FIG. 9 is a view showing the positional relation of the sample piece 8 and the sample piece table 9 when the sample piece 8 is attached to the sample piece table 9 in a state in which the rotation is performed by 180 degrees in this embodiment, and FIG. 10 is a view showing the positional relation of the sample piece 8 and the sample piece table 9 when the sample piece 8 is attached to the sample piece table 9 in a state in which the rotation is performed by 180 degrees in this embodiment.

Although not particularly shown in the figure, the sample piece 8 can be attached to the sample piece table 9 in an arbitrary positional relation by allowing the rotation stage 5 and the XYZ orthogonal stage 6 to perform the compucentric rotation operation by an arbitrary angle. By the method described above, the task of providing a method of attaching the sample piece 8 to the sample piece table 9 in a state in which the rotation is easily performed by 90 degrees, 180 degrees or an arbitrary number degrees can be solved.

Third Embodiment

Figure 11:
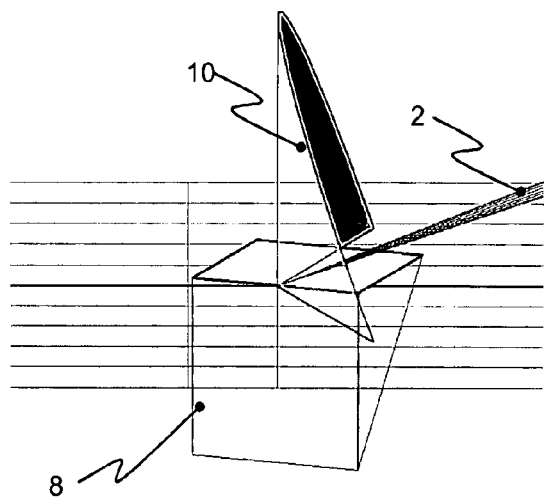
FIG. 11 is a view showing a state just after a sample piece is fixed to the manipulator in a third embodiment.
Figure 12:
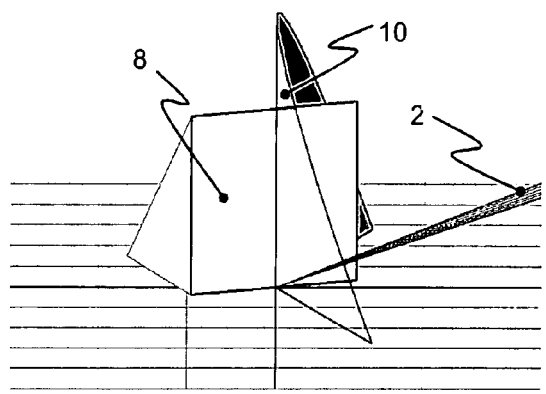
FIG. 12 is a view showing a state in which a posture is shifted such that a horizontal plane of the wedge-shaped sample piece is upright by operating the manipulator rotation axis in the third embodiment.

In the first and second embodiments, the upright plate-shaped sample piece 8 is disclosed as an example to observe the cross section thereof. However, in this embodiment, preparing a sample for performing TEM observation on the plane of the sample 7 is disclosed as an example. The ion beam etching using the focused ion beam system is performed only from the upper side or the tilted upper side of the sample in principle. Accordingly, for example, a sample piece for plane observation is prepared in a wedge shape such that a surface of the sample is one surface as shown in FIG. 11. A position of this sample piece 8 is set such that the intersection line 11 coincides with a direction to be set as a vertical direction when the sample piece is attached to the sample piece table 9. Then, the sample piece 8 is fixed to the manipulator 1, the sample stage is retreated, and then the manipulator rotation axis 2 is operated in the same manner as in the first and second embodiments. In this manner, a posture in which the plane part is upright can be made. FIG. 11 is a view showing a state just before the sample piece 8 formed in a wedge shape in this embodiment is attached to the manipulator 1, and FIG. 12 is a view showing a state in which the posture is shifted such that the plane which is a horizontal plane of the sample piece 8 at the time that the sample piece is in the sample 7 is upright by operating the manipulator rotation axis 2 from the state of FIG. 11. After the above-described courses, the sample piece 8 is attached to the sample piece table 9 attached to be upright in the same manner as in the first embodiment.

In this manner, the sample piece 8 for plane observation can be easily attached to the sample piece table 9.

Other Embodiments

As is obvious from the above-described embodiments, the positional relation of the sample piece 8 and the intersection line 11 and the rotation angle of the manipulator rotation axis are determined when the manipulator attachment angle 12 is set. Accordingly, a system for automatically rotating the sample stage and the manipulator only by specifying the desired sample posture shifting can be made.

What is claimed is:

1. A sample preparing device comprising:
   a sample stage having a surface for supporting a sample and being mounted to undergo rotation about at least one rotation axis; and
   a manipulator mounted to undergo rotation about a manipulator rotation axis independently of the sample stage, the manipulator being disposed relative to the sample stage so that an angle between the manipulator rotation axis and the surface of the sample stage is in the range of 0 to 45 degrees, the manipulator being configured to support a sample piece of the sample at a position substantially overlapping with the manipulator rotation axis;
   wherein the sample stage is operable to undergo a rotation operation to bring a preselected direction of the sample piece into coincidence with an intersection line between a plane formed by a surface of the sample piece and a conical side plane obtained by rotating, around the manipulator rotation axis of the manipulator, a line segment which is vertical to the surface of the sample piece and of which one end corresponds to an intersection of the surface of the sample and the manipulator rotation axis; and
   wherein the manipulator is operable to undergo a rotation operation to rotate the sample piece to a preselected position in the state in which the manipulator supports the sample piece and the preselected direction of the sample piece coincides with the intersection line.

2. A sample preparing device according to claim 1; wherein the sample stage has a sample piece table for supporting the sample piece in a state in which the sample piece extends in a direction upright with respect to the surface of the sample stage.

3. The A sample preparing device according to claim 2;
wherein the sample piece is a thin sample portion of the sample for a transmission electron microscope for cross-section observation or a thin sample portion of the sample for a transmission electron microscope prior to final processing of the sample;
wherein the preselected direction of the sample piece is a horizontal direction parallel to an observing cross section of the sample piece;
wherein the sample piece table extends upright with respect to the surface of the sample stage; and
wherein the sample piece is configured to be supported by the sample piece table in a posture in which the sample piece is rotated by 90 degrees around a line normal to the observing cross section.

4. A sample preparing device according to claim 2;
wherein the sample piece is a thin sample portion of the sample for an electron microscope for cross section observation or a thin sample for an electron microscope prior to final processing of the sample;
wherein during a rotation operation, the manipulator controls a position of the sample piece such that an observing cross section of the sample piece becomes horizontal by setting a direction of a line normal to the observing cross section as the preselected direction of the sample piece; and
the sample piece table is mounted horizontally with respect to the surface of the sample stage, the sample stage being configured to undergo a rotation operation about the at least one rotation axis to rotate the sample piece table to a preselected position with respect to the sample piece, the sample piece being supported by the sample piece table while the sample piece table is at the preselected position such that an arbitrary direction of the observing cross section of the sample piece extends in the direction upright with respect to the surface of the sample stage.

5. A sample preparing device according to claim 2;
wherein the sample piece is a thin sample portion of the sample for a transmission electron microscope for plane observation or a thin sample portion of the sample for a transmission electron microscope prior to final processing of the sample; and
wherein the sample piece table is mounted vertically with respect to the surface of the sample stage for supporting the sample piece so that a horizontal plane of the sample piece extends in the direction upright with respect to the surface of the sample stage.

6. A sample preparing device according to claim 3; further comprising means for automatically rotating the sample stage in accordance with the preselected direction of the sample piece to position the surface of the sample stage at one of the angles in the range of 0 to 45 degrees relative to the manipulator rotation axis.

7. A method of shifting a sample posture, the method comprising:
providing a sample stage having a surface for supporting a sample and being operable to undergo a rotation operation about at least one rotation axis;
providing a manipulator operable to undergo rotation about a manipulator rotation axis independently of the sample stage, the manipulator being disposed relative to the sample stage so that an angle between the manipulator rotation axis and the surface of the sample stage is in the range of 0 to 45 degrees, the manipulator being configured to support a sample piece of the sample at a position substantially overlapping with the manipulator rotation axis;
operating the sample stage so that a preselected direction of the sample piece is brought into coincidence with an intersection line between a plane formed by a surface of the sample piece and a conical side plane obtained by rotating, around the manipulator rotation axis of the manipulator, a line segment which is vertical to the surface of the sample piece and of which one end corresponds to an intersection of the surface of the sample and the manipulator rotation axis;
operating the manipulator to support the sample piece; and
operating the manipulator to rotate the sample piece to a preselected position in the state in which the manipulator supports the sample piece and the preselected direction of the sample piece coincides with the intersection line.

8. A sample preparing device according to claim 1; wherein the preselected direction is a longitudinal direction of the sample piece.

9. A sample preparing device according to claim 1; wherein the sample stage has a sample piece table corresponding to the preselected position of the sample piece.

10. A sample preparing device according to claim 1; wherein the angle between the manipulator rotation axis and the surface of the sample stage is 20 degrees.

11. A method according to claim 7; wherein the preselected direction is a longitudinal direction of the sample piece.

12. A method according to claim 7; wherein the sample stage has a sample piece table corresponding to the preselected position of the sample piece.

13. A method according to claim 7; wherein the angle between the manipulator rotation axis and the surface of the sample stage is 20 degrees.

14. A sample preparing device comprising:
a sample stage that supports a sample having a sample piece, the sample stage being mounted to undergo rotation about a first rotation axis to bring a preselected direction of the sample piece into coincidence with an intersection line between first and second planes, the first plane being formed by a surface of the sample piece; and
a manipulator configured to hold the sample piece and mounted to undergo rotation about a second rotation axis independently of the sample stage to rotate the sample piece to a preselected position in the state in which the preselected direction of the sample piece coincides with the intersection line, the manipulator being disposed relative to the sample stage so that an angle between the second rotation axis and the surface of the sample is in the range of 0° to 45°, the second plane corresponding to a plane obtained by rotating around the second rotation axis a line segment which is vertical to the surface of the sample and of which one end corresponds to an intersection between the surface of the sample and the second rotation axis.

15. A sample preparing device according to claim 14; wherein the preselected direction is a longitudinal direction of the sample piece.

16. A sample preparing device according to claim 14; wherein the sample stage has a sample piece table corresponding to the preselected position of the sample piece.

17. A sample preparing device according to claim 14; wherein the sample stage has a sample piece table for supporting the sample piece vertically with respect to the surface of the sample stage.

18. A sample preparing device according to claim 17; wherein the sample piece is a thin sample portion of the sample for a transmission electron microscope for observing a cross section of the thin sample portion; wherein the preselected direction of the sample piece is a horizontal direction parallel to an observing direction of the cross section of the sample piece; wherein the sample piece table is mounted vertically with respect to the surface of the sample stage; and wherein the sample piece is configured to be supported by the sample piece table with an orientation in which the sample piece is rotated by 90 degrees around a line normal to the observing direction of the cross section of the sample piece.

19. A sample preparing device according to claim 17; wherein the sample piece is a thin sample portion of the sample for an electron microscope for observing a cross section of the thin sample portion; wherein during a rotation operation, the manipulator controls a position of the sample piece such that an observing direction of the cross section of the sample piece becomes horizontal by setting a direction of a line normal to the observing direction as the preselected direction of the sample piece; and wherein the sample piece table is mounted horizontally with respect to the surface of the sample stage, the sample stage being configured to undergo a rotation operation about the first rotation axis to rotate the sample piece table to a preselected position with respect to the sample piece, and the sample piece being supported by the sample piece table while the sample piece table is at the preselected position such that the observing direction extends in the direction upright with respect to the surface of the sample stage.

20. A sample preparing device according to claim 17; wherein the sample piece is a thin sample portion of the sample for a transmission electron microscope for observing a plane of the thin sample portion; wherein the sample piece table is mounted vertically with respect to the surface of the sample stage for supporting the sample piece so that a horizontal plane of the sample piece extends in the direction upright with respect to the surface of the sample stage.

* * * * *